(12) United States Patent
Takahashi

(10) Patent No.: US 7,692,767 B2
(45) Date of Patent: Apr. 6, 2010

(54) PROJECTION OPTICAL SYSTEM AND EXPOSURE APPARATUS WITH THE SAME

(75) Inventor: Tomowaki Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 839 days.

(21) Appl. No.: 10/584,508

(22) PCT Filed: Dec. 21, 2004

(86) PCT No.: PCT/JP2004/019097

§ 371 (c)(1), (2), (4) Date: Jun. 23, 2006

(87) PCT Pub. No.: WO2005/062101

PCT Pub. Date: Jul. 7, 2005

(65) Prior Publication Data

US 2007/0126990 A1 Jun. 7, 2007

(30) Foreign Application Priority Data

Dec. 24, 2003 (JP) ............................. 2003-426617

(51) Int. Cl.
*G03B 27/52* (2006.01)
*G03B 27/42* (2006.01)
(52) U.S. Cl. .......................................... 355/55; 355/53
(58) Field of Classification Search ................... 355/55, 355/53, 67, 57; 250/492.2; 359/857, 365, 359/650
See application file for complete search history.

(56) References Cited

U.S. PATENT DOCUMENTS

| 5,686,728 | A | 11/1997 | Shafer |
| 5,815,310 | A | 9/1998 | Williamson |
| 6,183,095 | B1 | 2/2001 | Hudyma |
| 6,292,309 | B1 | 9/2001 | Sekita et al. |

(Continued)

FOREIGN PATENT DOCUMENTS

JP 09-211322 8/1997

(Continued)

OTHER PUBLICATIONS

International Search Report re: PCT/JP 2004/019097 mailed Apr. 5, 2005.

*Primary Examiner*—Peter B Kim
(74) *Attorney, Agent, or Firm*—Finnegan, Henderson, Farabow, Garrett & Dunner, L.L.P.

(57) ABSTRACT

A projection optical system comprises eight reflectors and forms a reduced image of a first surface (4) onto a second surface (7). It comprises a first reflective imaging optical system (G1) for forming an intermediate image of the first surface and a second reflective imaging optical system (G2) for forming an image of the intermediate image onto the second surface. The first reflective imaging optical system includes a first reflector (M1), a second reflector (M2), a third reflector (M3), and a fourth reflector (M4) successively as light enters from the first surface side. The second reflective imaging optical system includes a fifth reflector (M5), a sixth reflector (M6), a seventh reflector (M7), and an eighth reflector (M8) successively as light enters from the first surface side. This realizes a reflective projection optical system which can favorably correct aberrations while having a favorable reflection characteristic with respect to X-rays and keeping the reflectors from becoming bulky.

11 Claims, 9 Drawing Sheets

U.S. PATENT DOCUMENTS

| | | |
|---|---|---|
| 6,353,470 B1 | 3/2002 | Dinger |
| 6,556,648 B1 | 4/2003 | Bal et al. |
| 6,600,552 B2 | 7/2003 | Dinger |
| 6,710,917 B2 | 3/2004 | Mann et al. |
| 6,781,671 B2 | 8/2004 | Komatsuda |
| 6,902,283 B2 | 6/2005 | Dinger |
| 6,985,210 B2 | 1/2006 | Hudyma et al. |
| 7,151,592 B2 | 12/2006 | Hudyma et al. |
| 7,355,678 B2 | 4/2008 | Hudyma et al. |
| 7,375,798 B2 | 5/2008 | Hudyma et al. |
| 2002/0056815 A1 | 5/2002 | Mann et al. |
| 2002/0129328 A1 | 9/2002 | Komatsuda |
| 2002/0145718 A1 | 10/2002 | Dinger |
| 2004/0051857 A1 | 3/2004 | Hudyma et al. |
| 2004/0057134 A1 | 3/2004 | Dinger |
| 2004/0070743 A1 | 4/2004 | Hudyma et al. |
| 2004/0189968 A1 | 9/2004 | Terasawa |
| 2006/0050258 A1 | 3/2006 | Hudyma et al. |
| 2007/0070322 A1 | 3/2007 | Hudyma et al. |
| 2007/0153252 A1 | 7/2007 | Hudyma et al. |

FOREIGN PATENT DOCUMENTS

| | | |
|---|---|---|
| JP | 10-090602 | 4/1998 |
| JP | 2000-235144 A | 8/2000 |
| JP | 2002-107630 A | 4/2002 |
| JP | 2002-116382 A | 4/2002 |
| JP | 2002-139672 | 5/2002 |

PROJECTION OPTICAL SYSTEM AND EXPOSURE APPARATUS WITH THE SAME

CROSS REFERENCE TO RELATED APPLICATIONS

This application is a national phase application of International Application No. PCT/JP2004/019097, filed Dec. 21, 2004, and claims the priority of Japanese Patent Application No. 2003-426617, filed Dec. 24, 2003, the contents of both of which are incorporated herein by reference.

BACKGROUND OF THE INVENTION

1. Field of the Invention

The present invention relates to a projection optical system and an exposure apparatus comprising the projection optical system. For example, the present invention relates to a reflective projection optical system which is suitable for an X-ray projection exposure apparatus which transfers a circuit pattern on a mask onto a photosensitive substrate by a mirror projection scheme using X-rays.

2. Description of the Related Art

Exposure apparatus used for manufacturing semiconductor devices and the like have conventionally projected and transferred circuit patterns formed on a mask (reticle) onto a photosensitive substrate such as wafer through a projection optical system. The photosensitive substrate senses light upon the exposure and projection through the projection optical system, thereby yielding a resist pattern corresponding to a mask pattern.

The resolving power W of an exposure apparatus, which depends on the wavelength λ of exposure light and the numerical aperture NA of the projection optical system, is represented by the following expression (a):

$$W = K \cdot \lambda / NA \quad (K: \text{constant}) \tag{a}$$

Therefore, for improving the resolving power of the exposure apparatus, it is necessary to shorten the wavelength λ of exposure light or increase the numerical aperture NA of the projection optical system. Since it is difficult for the numerical aperture NA of the projection optical system to be a predetermined value or greater from the viewpoint of optical designs in general, it will be necessary for the exposure light to have a shorter wavelength from now on. For example, resolving powers of 0.25 μm and 0.18 μm are obtained when a KrF excimer laser having a wavelength of 248 nm and an ArF excimer laser having a wavelength of 193 nm are used as the exposure light, respectively. The resolving power can further be improved when X-rays having a wavelength shorter than these laser beams are used as the exposure light. For example, a resolving power of 0.1 μm or finer is obtained when an X-ray having a wavelength of 13 nm is used as the exposure light.

Meanwhile, since there are no usable transmissive optical materials and refractive optical materials when X-rays are used as the exposure light, a reflective projection optical system is used together with a reflective mask. Projection optical systems employable in exposure apparatus using X-rays as the exposure light have conventionally been disclosed in U.S. Pat. No. 5,815,310, its corresponding Japanese Patent Application Laid-Open No. H 9-211322, and U.S. Pat. No. 6,183,095B1, for example. Reflective optical systems each using eight reflectors have been disclosed in various modes in U.S. Pat. No. 5,686,728, its corresponding Japanese Patent Application Laid-Open No. H 10-90602, Japanese Patent Application Laid-Open No.2002-139672, and the like.

The foregoing will be summarized as:
Patent Document 1: U.S. Pat. No. 5,815,310
Patent Document 2: Japanese Patent Application Laid-Open No. H9-211322
Patent Document 3: U.S. Pat. No. 6,183,095B 1
Patent Document 4: U.S. Pat. No. 5,686,728
Patent Document 5: Japanese Patent Application Laid-Open No. H10-90602
Patent Document 6: Japanese Patent Application Laid-Open No. 2002-139672

The conventional reflective optical system disclosed in Japanese Patent Application Laid-Open No. H9-211322 is a relatively bright optical system comprising six reflectors and having a numerical aperture of 0.25, but fails to achieve a brighter NA.

The reflective optical system in accordance with the first embodiment described in U.S. Pat. No. 6,183,095B1 is a relatively bright optical system comprising six reflectors and having a numerical aperture NA of 0.25, but fails to achieve a brighter NA, either. A reflective optical system constructed by eight reflectors has been known from U.S. Pat. No. 5,686,728. Though this reflective optical system is made compact while securing a large numerical aperture (NA) of 0.3 or greater, the beam incidence angle at each surface of the eight reflectors is 40° to 50°, which is too large. This makes it difficult to design a reflective multilayer film, and is disadvantageous in terms of securing accuracy at the time of manufacture and stability when performing the projection.

In the reflective optical systems in accordance with the embodiments described in Japanese Patent Application Laid-Open No. 2002-139672, the curvatures of the reflectors are too large, though the angles of incidence of beams at the reflectors are not so large. Therefore, there are no effective means for inspecting errors in forms of aspherical reflectors, whereby the inspection is difficult.

The currently most effective inspecting means is a method known as PDI. The PDI is a means for inspecting a reflector by making light passing through a pinhole reflect with the reflector. In the case where an inspection is performed by the PDI, a higher inspection accuracy and a better effect are obtained when the absolute value of radius of curvature of each reflector is relatively small.

SUMMARY OF INVENTION

In view of the problems mentioned above, it is an object of the present invention to provide a projection optical system whose numerical aperture (NA) is a predetermined value or greater and an exposure apparatus comprising the projection optical system. It is another object of the present invention to provide an exposure apparatus having a high resolving power while, for example, using X-rays as exposure light by employing the projection optical system of the present invention in the exposure apparatus.

For solving the above-mentioned problems, the embodiment provides a projection optical system for forming a reduced image of a first surface onto a second surface comprising a first reflective imaging optical system for forming an intermediate image of the first surface and a second reflective imaging optical system for forming an image of the intermediate image onto the second surface; the first reflective imaging optical system including a concave first reflector, a concave second reflector, a convex third reflector, and a concave fourth reflector successively as light enters from the first surface side; the second reflective imaging optical system including a concave fifth reflector, a concave sixth reflector, a convex seventh reflector, and a concave eighth reflector successively as light enters from the first surface side.

Preferably, the fourth reflector is arranged in a space between the second and third reflectors. Preferably, the position of the fourth reflector satisfies the condition of $0.2 < d1/d2 < 0.8$, where d1 is the surface separation between the third and fourth reflectors, and d2 is the surface separation between the second and third reflectors.

Preferably, absolute values of radii of curvature of all the reflectors fall within the range of 300 mm to 5000 mm. Preferably, letting R3 be the radius of curvature of the third reflector, the condition of $400 \text{ mm} < R3 < 2000 \text{ mm}$ is satisfied.

Preferably, letting R2 be the radius of curvature of the second reflector, the condition of $0 < R2 < 3000 \text{ mm}$ is satisfied. Preferably, letting R6 be the radius of curvature of the sixth reflector, the condition of $0 < R6 < 4000 \text{ mm}$ is satisfied.

Preferably, for improving the resolving power as much as possible, the image-side numerical aperture NA is no less than 0.3. More preferably, the numerical aperture NA is 0.45.

The embodiment provides an exposure apparatus comprising an illumination system for illuminating a mask set on the first surface, and the projection optical system mentioned above for projecting and exposing a pattern of the mask onto a photosensitive substrate set on the second surface.

Preferably, the illumination system includes a light source for supplying an X-ray as exposure light, and projects and exposes the pattern of the mask onto the photosensitive substrate by moving the mask and photosensitive substrate relative to the projection optical system.

DETAILED DESCRIPTION OF THE INVENTION

Figure 1:
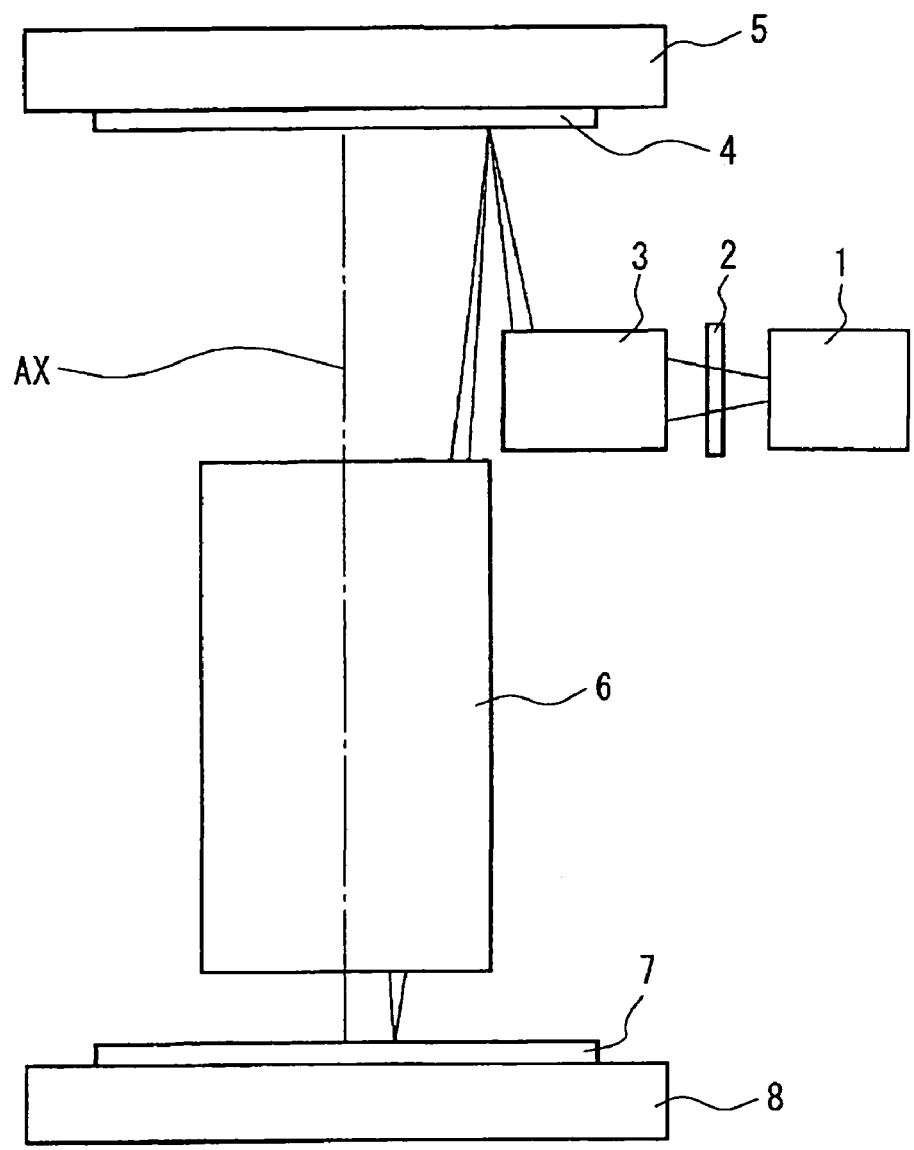
FIG. 1 is a view schematically showing the structure of the exposure apparatus in accordance with an embodiment of the present invention.

In the projection optical system of the present invention, light from a first surface (object surface) forms an intermediate image of the first surface through a first reflective imaging optical system G1. Then, light from the intermediate image of the first surface formed through the first reflective imaging optical system G1 forms an image of the intermediate image (a reduced image of the first surface) onto a second surface (image surface).

Here, the projection optical system of the present invention is constructed by a concave first reflector M1 for reflecting the light from the first surface, a concave second reflector M2 which is a reflector for reflecting the light reflected by the first reflector M1 and is equipped with an aperture stop AS, a convex third reflector M3 for reflecting the light reflected by the second reflector M2, a concave fourth reflector M4 for reflecting the light reflected by the third reflector M3, a concave fifth reflector M5, a concave sixth reflector M6 for reflecting the light reflected by the concave fifth reflector M5, a convex seventh reflector M7 for reflecting the light reflected by the sixth reflector M6, and a concave eighth reflector M8 for reflecting the light reflected by the seventh reflector M7.

Here, depending on slight differences among powers of the reflectors, the projection optical system can be configured such that the intermediate image of the first surface is present between M4 and M5 or between M5 and M6. Therefore, the intermediate image of the first surface is present on an optical path between M4 and M6. However, it does not matter so much between which reflectors the intermediate image of the first surface is present, whereas the order of concave and convex reflectors in the whole optical system is important.

When the intermediate image of the first surface is present very near a reflector, images of fine structures of the reflector and attached dust on the surface of the reflector may overlap the projected image. Further, the partial diameter of the reflector (the effective diameter of beam bundles on the reflector) becomes too small, which is more likely to cause a problem in terms of manufacturing tolerances. Therefore, the intermediate image of the first surface must be located at a position separated from the individual reflectors.

The present invention employs a so-called double imaging optical system in which light from an intermediate image of the first surface formed through the first reflective imaging optical system G1 forms an image of the intermediate image (a reduced image of the first surface) onto the second surface (image surface). The double imaging optical system is constructed by concave, concave, convex, concave, concave, concave, convex, and concave reflectors in succession as light enters from the object side, whereas such an arrangement enables the double imaging optical system to keep each reflector from increasing its radius of curvature and suppress the angle of incidence of beams at each reflector, and has made it possible to develop a compact optical system with a large NA and a restricted effective diameter in each reflector.

First, among the first four reflectors counted from the object side constituting the first reflective imaging optical system G1, a convex reflector is employed as the third reflector from the object side, while concave reflectors are arranged thereabout. This suppresses effective diameters of reflectors which are likely to become large from increasing, suppresses the angle of incidence of beam bundles at each reflector, and holds the absolute values of radii of curvature of the reflectors within the range of 300 mm to 5000 mm, thereby enabling designs taking account of easiness in manufacturing.

Among the four reflectors constituting the second reflective imaging optical system G2, a convex reflector is employed as the third reflector from the object side, while concave reflectors are arranged thereabout, whereby the angle of incidence of beam bundles at each reflector can be suppressed, while suppressing effective diameters of reflectors which are likely to become large from increasing. This also holds the absolute values of radii of curvature of the reflectors within the range of 300 mm to 5000 mm, thereby enabling designs taking account of easiness in manufacturing.

Thus arranging two convex mirrors with a favorable balance in a plurality of concave mirrors can make it possible to attain a favorable value of Petzval sum and favorably correct each aberration, which not only makes it possible to yield a high-performance optical system, but also can keep the beam incidence angles at the reflectors small and suppress effective diameters of reflectors having appropriate radii of curvature to small values.

Since the whole optical system is a reduction optical system, continuously using concave mirrors on the object side of the first reflective imaging optical system G1 and second reflective imaging optical system G2 guides beam bundles toward the image surface with ease. Therefore, such an arrangement of reflectors as in the present invention can achieve an optical system satisfying five features of high NA, high performance, small effective diameters in reflectors, small light beam incidence angles at reflecting surfaces, and small radii of curvature in reflecting surfaces at the same time.

Each of the constructional set of the second, third, and fourth reflectors and the constructional set of the sixth, seventh, and eighth reflectors is formed by concave, convex, and concave mirrors, whereby each reflector maintains an appropriate radius of curvature which is neither a large radius of curvature whose absolute value is 5000 mm or greater nor a small radius of curvature whose absolute value is 300 mm or less. Further, while keeping an appropriate radius of curvature in each reflector, an optical system having a high optical performance with a high NA can be achieved.

Further, the fourth reflector M4 is placed in the space between the second reflector M2 and third reflector M3, the third reflector M3 and fourth reflector M4 are respectively constituted by convex and concave reflective optical systems each having a strong power, and the radius of curvature R3 of the third reflector M3 has a small value falling within the range of 400 mm to 2000 mm in the present invention, whereby the third reflector M3 and fourth reflector M4 are easy to produce and inspect, which makes it possible to yield a small, lightweight first imaging optical system.

Though reflecting surfaces are harder to manufacture accurately as they are closer to a plane by increasing their radii of curvature in general, the radius of curvature R2 in the second reflector M2 having a large radius of curvature is suppressed to 3000 mm or less, and the radius of curvature R6 in the sixth reflector M6 is suppressed to 4000 mm or less, whereby reflecting surfaces can be manufactured favorably.

Preferably, in the present invention, the position of the fourth reflector M4 satisfies the following conditional expression (1). Here, d1 is the surface separation between the third reflector M3 and fourth reflector M4, and d2 is the surface separation between the second reflector M2 and third reflector M3.

$$0.2 < d1/d2 < 0.8 \qquad (1)$$

Falling short of the lower limit of conditional expression (1) is unfavorable, since this makes it difficult to distinguish beam bundles incident at the third reflector M3 from beam bundles emitted from the third reflector M3. Exceeding the upper limit of conditional expression (1) is unfavorable, since the diameter of the fourth reflector M4 becomes too large.

Placing an aperture stop immediately in front of the second reflector M2 yields a small optical system keeping beam bundles from being eclipsed, whereas employing a structure in which a reduced image of the first surface is formed on the second surface by double imaging can favorably correct distortion and realize a favorable optical performance while keeping a small size and an imaging magnification at ¼.

Employing the foregoing arrangement suppresses the maximum diameter of reflectors and can appropriately arrange the individual reflectors, aperture stop, and the like without eclipsing beam bundles.

Keeping angles of incidence of beams at the third and sixth reflectors M3 and M6 small can suppress effective diameters of the fourth and fifth reflector M4 and M5 which are likely to become large.

As in the foregoing, the present invention can realize a reflective projection optical system which can have a favorable reflecting characteristic with respect to X-rays and which can favorably correct aberrations as well while keeping reflectors from becoming bulky.

Preferably, the maximum angle A of incidence of beams at the third and sixth reflectors M3 and M6 satisfies the following conditional expression (2):

$$A < 30° \qquad (2)$$

Exceeding the upper limit of conditional expression (2) is unfavorable, since the maximum angle A of incidence of beam at the reflective multilayer film becomes so large that ununiformity of reflection is likely to occur, while a sufficiently high reflectance cannot be obtained.

Preferably, in the present invention, the inclination a between a principal ray of an incident beam at the first reflector M1 from the first surface and an optical axis satisfies the following conditional expression (3):

$$5° < |\alpha| < 10° \qquad (3)$$

Exceeding the upper limit of conditional expression (3) is unfavorable, since a shadow caused by reflection becomes more influential when the first surface is provided with a reflective mask. On the other hand, falling short of the lower limit of conditional expression (3) is unfavorable, since incident light and reflected light interfere with each other when the first surface is provided with a reflective mask.

Preferably, the effective diameter ($\phi$M of each of the reflectors M1 to M8 satisfies the following conditional expression (4):

$$\phi M \leq 700 \text{ nm}$$

Exceeding the upper limit of conditional expression (4) is unfavorable, since the effective diameter of the reflector becomes so large that the optical system increases its size.

For favorably correcting aberrations and improving optical performances, it will be preferred in the present invention if the reflecting surface of each reflector is formed into an aspheric surface which is rotationally symmetrical about an optical axis and the maximum order of the aspheric surface defining each reflecting surface is not less than 10. In the case where thus constructed projection optical system is employed in an exposure apparatus, for example, favorable imaging is possible even when there are irregularities on a wafer within a focal depth of the projection optical system.

When the projection optical system of the present invention is employed in an exposure apparatus, the exposure apparatus can use X-rays as exposure light. In this case, a mask and a photosensitive substrate are moved relative to the projection optical system, so as to project and expose a pattern of the mask onto the photosensitive substrate. As a result, high-precision microdevices can be manufactured under favorable exposure conditions by using a scanning exposure apparatus with a high resolving power.

Embodiments of the present invention will be explained with reference to the accompanying drawings.

Figure 2:
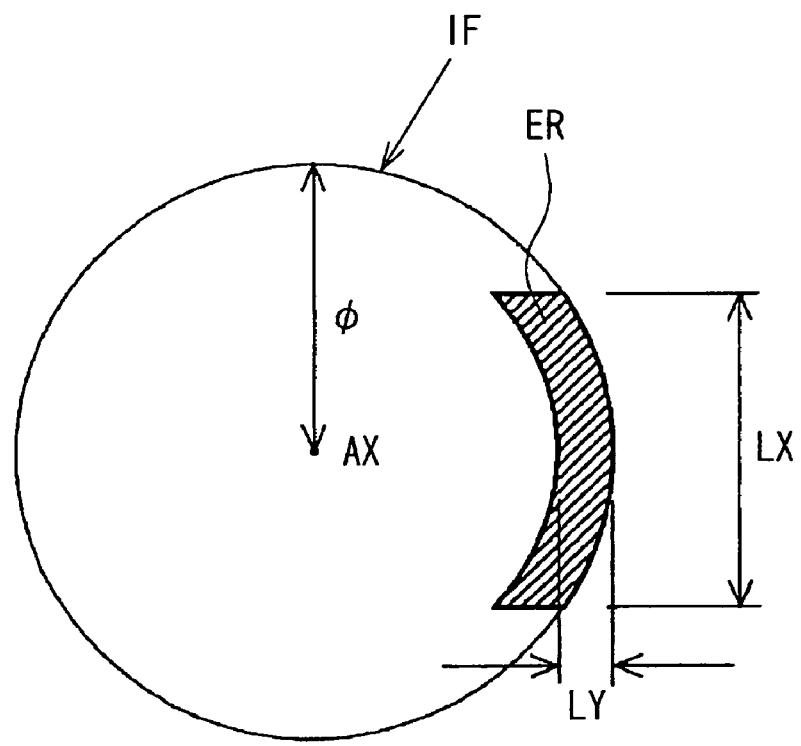
FIG. 2 is a view showing the positional relationship between an arc-like exposure region (i.e., effective exposure region) formed on a wafer and an optical axis.

FIG. 1 is a view schematically showing the exposure apparatus in accordance with an embodiment of the present invention. FIG. 2 is a view showing the positional relationship between an arc-like exposure region (i.e., effective exposure region) formed on a wafer and an optical axis. In FIG. 1, the Z-axis is set along an optical axis direction of the projection optical system, i.e., a normal direction of the wafer that is a photosensitive substrate, the Y-axis is set in a direction parallel to the sheet surface of FIG. 1 within a wafer surface, and the X-axis is set in a direction perpendicular to the sheet surface of FIG. 1 within the wafer surface.

The exposure apparatus of FIG. 1 comprises a laser plasma X-ray source 1, for example, as a light source for supplying exposure light. The light emitted from the X-ray source 1 is made incident at an illumination optical system 3 through a wavelength-selective filter 2. Here, the wavelength-selective filter 2 has such a characteristic as to selectively transmit therethrough only an X-ray having a predetermined wavelength (13.5 nm) from the light supplied by the X-ray source 1 and prevents the other wavelength light from passing therethrough.

By way of the illumination optical system 3 constructed by a plurality of reflectors, the X-ray transmitted through the wavelength-selective filter 2 illuminates a reflective mask 4 formed with patterns to be transferred. A mask stage 5 which is movable along the Y-axis holds the mask 4 such that its pattern surface extends along the XY plane. The movement of the mask stage 5 is configured such as to be measured by a laser interferometer which is not depicted. Thus, an arc-like illumination region symmetrical about the Y-axis is formed on the mask 4.

Through a reflective projection optical system 6, light from a pattern of the illuminated mask 4 forms an image of the mask pattern on a wafer 7 which is a photosensitive substrate. Namely, an arc-like exposure region symmetrical about the Y-axis is formed on the wafer 7 as shown in FIG. 2. As FIG. 2 illustrates, within a circular region (image circle) IF having a radius $\phi$ about the optical axis AX, an arc-like effective exposure region ER having an X-directional length of LX and a Y-directional length of LY is set so as to come into contact with the image circle IF.

A wafer stage 8 two-dimensionally movable along the X- and Y-axes holds the wafer 7 such that the exposure surface of the wafer 7 extends along the XY plane. As with the mask stage 5, the movement of the wafer stage 8 is configured such as to be measured by a laser interferometer which is not depicted. Thus, when scan exposure (scanning exposure) is performed while moving the mask stage 5 and wafer stage 8 along the Y-axis, i.e., moving the mask 4 and wafer 7 along the Y-axis relative to the projection optical system 6, the pattern of the mask 4 is transferred to one exposure region of the wafer 7.

Assuming that the projection magnification (transfer magnification) of the projection optical system 6 is ¼, synchronous scanning is performed while the moving rate of the wafer stage 8 is set to ¼ that of the mask stage 5. As scanning exposure is repeated while two-dimensionally moving the wafer stage 8 along the X- and Y-axes, the patterns of the mask 4 are successively transferred to respective exposure regions of the wafer 7. Specific structures of the projection optical system 6 will now be expired with reference to first to third examples.

In each example, the projection optical system 6 is constituted by a first reflective imaging optical system G1 for forming an intermediate image of a pattern of the mask 4 and a second reflective imaging optical system G2 for forming an image of the intermediate image of the mask pattern (a secondary image of the pattern of the mask 4) onto the wafer 7. Here, the first reflective imaging optical system G1 is constructed by four reflectors M1 to M4, whereas the second reflective imaging optical system G2 is constructed by four reflectors M5 to M8. When the intermediate image is present between M5 and M6, however, the first reflective imaging optical system G1 is constructed by five reflectors M1 to M5, whereas the second reflective imaging optical system G2 is constructed by three reflectors M6 to M8.

The reflecting surfaces of all the reflectors in each example are formed into aspheric surfaces each of which is rotationally symmetrical about the optical axis. In each example, an aperture stop AS is arranged immediately in front of the second reflector M2. The projection optical system 6 in each example is an optical system which is telecentric on the wafer side (image side).

Though the third reflector M3 is arranged in a space on the image surface side of the first reflector M1 in each example, this is not restrictive, whereby the same operation can also be obtained when the third reflector M3 is arranged in a space on the object side of the first reflector M1.

The aspheric surface in each example is represented by the following expression (b):

Expression 1

$$z = (y^2/r) / \left\{ 1 + \{1 - (1+\kappa) \cdot y^2/r^2\}^{1/2} \right\} + C4 \cdot y^4 + C6 \cdot y^6 + C8 \cdot y^8 + C10 \cdot y^{10} + \cdots \quad (b)$$

where y is the height in a direction perpendicular to the optical axis, z is the distance (sag value) from a tangential plane at the vertex of the aspheric surface to a position on the aspheric surface at the height y, r is the vertex radius of curvature, $\kappa$ is the conical coefficient, and Cn is the aspherical surface coefficient of the n-th order.

EXAMPLE 1

Figure 3:
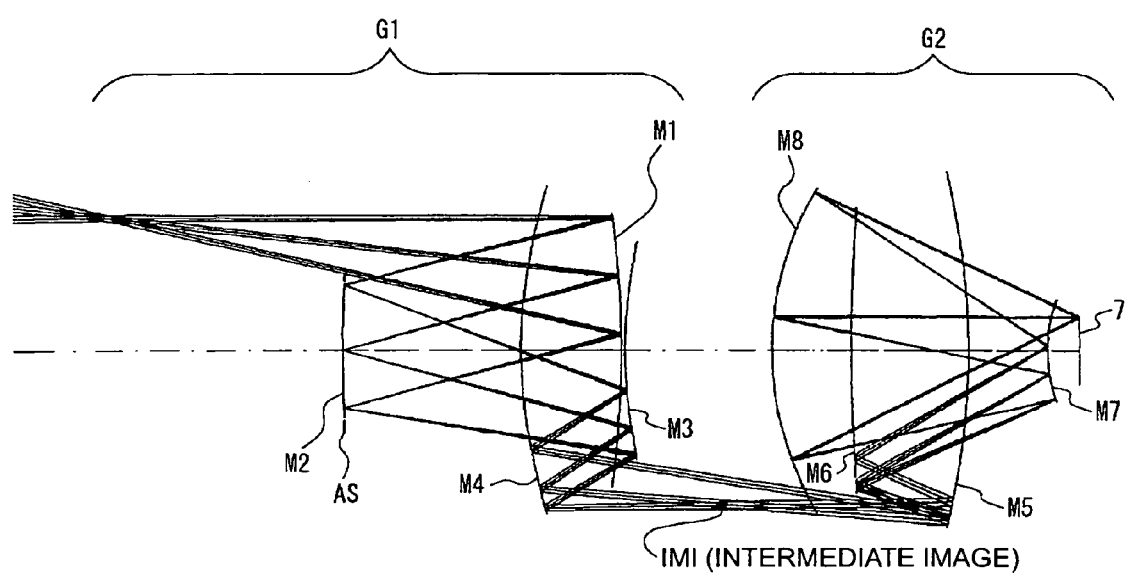
FIG. 3 is a view showing the structure of the projection optical system in accordance with a first example of the embodiment.

FIG. 3 is a view showing the structure of the projection optical system in accordance with the first example. Referring to FIG. 3, the light from the mask 4 (not depicted in FIG. 3) in the projection optical system of the first example is successively reflected by the reflecting surface of the concave first reflector M1, the reflecting surface of the concave second reflector M2, the reflecting surface of the convex third reflector M3, and the reflecting surface of the concave fourth reflector M4, which constitute the first reflective imaging optical system G1, and then forms an intermediate image of a mask pattern. The light from the intermediate image of the mask pattern formed by way of the first reflective imaging optical system G1 is successively reflected by the reflecting surface of the concave fifth reflector M5, the reflecting surface of the concave sixth reflector M6, the reflecting surface of the convex seventh reflector M7, and the reflecting surface of the concave eighth reflector M8, which constitute the second reflective imaging optical system G2, and then forms a reduced image (secondary image) of the mask pattern on the wafer 7.

The following Table 1 lists values of items regarding the projection optical system in accordance with the first example. In Table 1, $\lambda$ is the wavelength of exposure light, $\beta$ is the projection magnification, NA is the numerical aperture on the image side (wafer side), H0 is the maximum object height on the mask 4, $\phi$ is the radius (maximum image height) of the image circle IF on the wafer 7, LX is the size of the effective exposure region ER along the X-axis, and LY is the size of the effective exposure region ER along the Y-axis.

The surface number refers to the order of reflecting surfaces from the mask side along the beam advancing direction from the mask surface acting as the object surface to the wafer surface acting as the image surface, r is the radius of curvature at the vertex of each reflecting surface (mm), and d is the spacing of each optical surface along the optical axis, i.e., surface separation (mm). The surface separation d is supposed to change its polarity each time when reflected. Regardless of the beam incidence direction, radii of curvature of surfaces which are convex and concave toward the mask are defined positive and negative, respectively. The foregoing notation also holds in subsequent Tables 2 and 3.

TABLE 1

(Principle items)

$\lambda = 13.5$ nm
$\beta = \frac{1}{4}$
NA = 0.45
H0 = 176 mm
$\phi = 44$ mm
LX = 26 mm
LY = 2 mm (Items regarding optical members)

| Surface No. | r | d | |
|---|---|---|---|
| | (Mask surface) | 662.549 | |
| 1 | −1230.87 | −363.363 | (first reflector M1) |
| 2 | ∞ | 0.0 | (aperture stop AS) |
| 3 | 1395.55 | 368.052 | (second reflector M2) |
| 4 | 530.476 | −135.541 | (third reflector M3) |
| 5 | 623.557 | 474.733 | (fourth reflector M4) |
| 6 | −989.927 | −150.0 | (fifth reflector M5) |
| 7 | 2502.814 | 250.0 | (sixth reflector M6) |
| 8 | 197.676 | −350.0 | (seventh reflector M7) |
| 9 | 414.860 | 390.0 | (eighth reflector M8) |
| | (wafer surface) | | |

(Data of aspheric surfaces)

First surface $\kappa = 0.000000$
$C4 = 0.160791 \times 10^{-8}$   $C6 = -0.282672 \times 10^{-13}$
$C8 = 0.545500 \times 10^{-18}$   $C10 = -0.916171 \times 10^{-23}$
$C12 = 0.119454 \times 10^{-27}$   $C14 = -0.928728 \times 10^{-33}$
$C16 = 0.251527 \times 10^{-38}$ Second surface $\kappa = 0.000000$
$C4 = -0.136607 \times 10^{-8}$   $C6 = -0.302584 \times 10^{-13}$
$C8 = -0.669941 \times 10^{-18}$   $C10 = -0.246947 \times 10^{-22}$
$C12 = 0.547010 \times 10^{-27}$   $C14 = -0.114715 \times 10^{-30}$
$C16 = 0.494514 \times 10^{-35}$ Third surface $\kappa = 0.000000$
$C4 = -0.738544 \times 10^{-8}$   $C6 = -0.155467 \times 10^{-14}$
$C8 = -0.602031 \times 10^{-18}$   $C10 = 0.319940 \times 10^{-22}$
$C12 = -0.139342 \times 10^{-26}$   $C14 = 0.331308 \times 10^{-31}$
$C16 = -0.327571 \times 10^{-36}$ Fourth surface $\kappa = 0.000000$
$C4 = -0.133963 \times 10^{-8}$   $C6 = -0.100476 \times 10^{-13}$
$C8 = 0.146111 \times 10^{-18}$   $C10 = -0.650862 \times 10^{-23}$
$C12 = 0.119928 \times 10^{-27}$   $C14 = -0.121905 \times 10^{-32}$
$C16 = 0.404355 \times 10^{-38}$ Fifth surface $\kappa = 0.000000$
$C4 = 0.333932 \times 10^{-9}$   $C6 = 0.345374 \times 10^{-14}$
$C8 = -0.824930 \times 10^{-18}$   $C10 = 0.252988 \times 10^{-22}$
$C12 = -0.404419 \times 10^{-27}$   $C14 = 0.341315 \times 10^{-32}$
$C16 = -0.120715 \times 10^{-37}$ TABLE 1-continued Sixth surface $\kappa = 0.000000$
$C4 = 0.100336 \times 10^{-08}$   $C6 = -0.529486 \times 10^{-13}$
$C8 = 0.140715 \times 10^{-17}$   $C10 = -0.372963 \times 10^{-22}$
$C12 = 0.717139 \times 10^{-27}$   $C14 = -0.839961 \times 10^{-32}$
$C16 = 0.437932 \times 10^{-37}$ Seventh surface $\kappa = 0.000000$
$C4 = -0.509744 \times 10^{-8}$   $C6 = 0.231566 \times 10^{-11}$
$C8 = -0.823302 \times 10^{-16}$   $C10 = -0.536424 \times 10^{-20}$
$C12 = 0.763865 \times 10^{-24}$   $C14 = -0.139661 \times 10^{-27}$
$C16 = -0.138918 \times 10^{-31}$ Eighth surface $\kappa = 0.000000$
$C4 = 0.102876 \times 10^{-09}$   $C6 = 0.768125 \times 10^{-15}$
$C8 = 0.490135 \times 10^{-20}$   $C10 = 0.270578 \times 10^{-25}$
$C12 = 0.221937 \times 10^{-30}$   $C14 = 0.144064 \times 10^{-36}$
$C16 = 0.166581 \times 10^{-40}$ (Corresponding values to the conditional expressions)

$\phi M5 = 453.46$ mm
$\phi M4 = 414.15$ mm
(1) $A(M3) = 19.63°$; $A(M6) = 26.1°$
(2) $|\alpha| = 6.53°(114.00$ mrad$)$
(3) $\phi M = 453.46$ mm (maximum at the fifth reflector M5)

Figure 4:
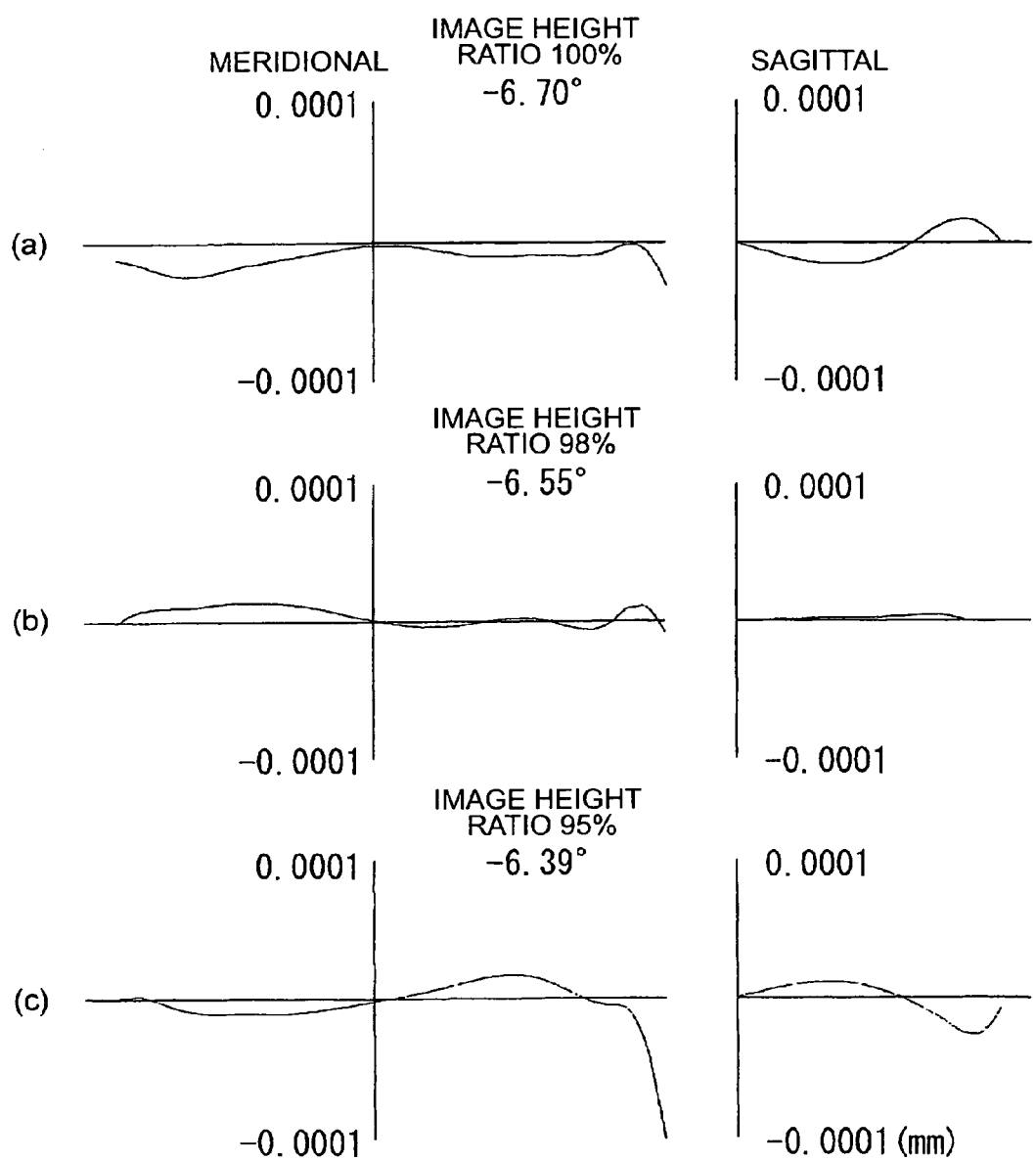
FIG. 4 is a chart showing coma generated by the projection optical system of the first example.

FIG. 4 is a chart showing coma generated by the projection optical system of the first example. FIGS. 4(a), 4(b), and 4(c) show meridional coma and sagittal coma at image heights of 100%, 98%, and 95%, respectively. The aberration charts shown in FIG. 4 clarify that coma are favorably corrected in the area corresponding to the effective exposure region ER in the first example. Though not depicted, it has also been verified that aberrations other than coma, such as spherical aberration and distortion, are favorably corrected in the area corresponding to the effective exposure region ER.

EXAMPLE 2

Figure 5:
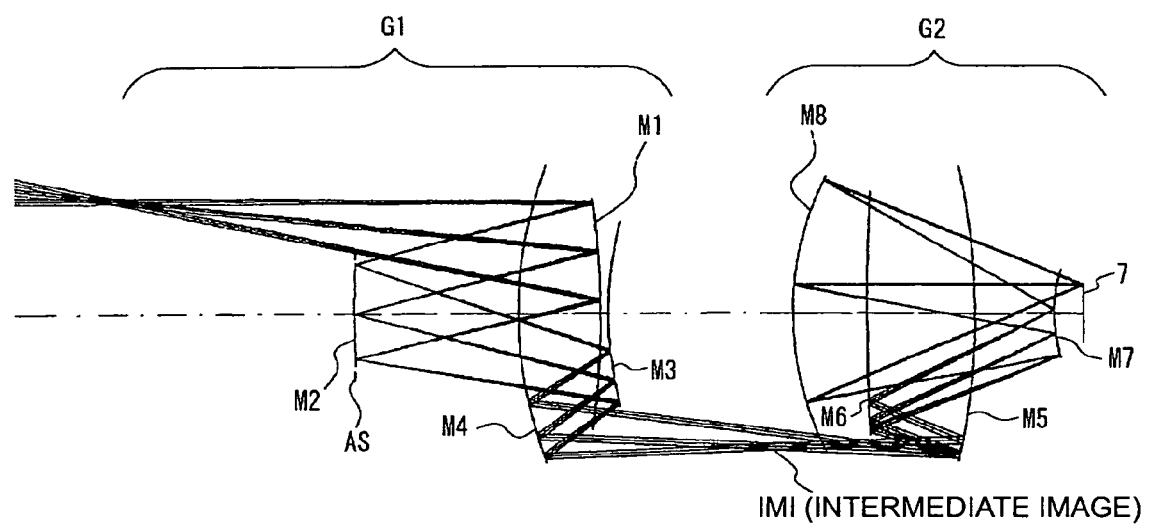
FIG. 5 is a view showing the structure of the projection optical system in accordance with a second example of the embodiment.

FIG. 5 is a view showing the structure of the projection optical system in accordance with the second example of this embodiment. Referring to FIG. 5, the light from the mask 4 (not depicted in FIG. 5) is successively reflected by the reflecting surface of the concave first reflector M1, the reflecting surface of the concave second reflector M2, the reflecting surface of the convex third reflector M3, and the reflecting surface of the concave fourth reflector M4, which constitute the first reflective imaging optical system G1, and then forms an intermediate image of a mask pattern in the projection optical system of the second example as in the first example. The light from the intermediate image of the mask pattern formed by way of the first reflective imaging optical system G1 is successively reflected by the reflecting surface of the concave fifth reflector M5, the reflecting surface of the concave sixth reflector M6, the reflecting surface of the convex seventh reflector M7, and the reflecting surface of the concave eighth reflector M8, which constitute the second reflective imaging optical system G2, and then forms a reduced image (secondary image) of the mask pattern on the wafer 7.

The following Table 2 lists values of items regarding the projection optical system in accordance with the second example.

TABLE 2

(Principle items)

$\lambda$ = 13.5 nm
$\beta$ = ¼
NA = 0.4
H0 = 168 mm
$\phi$ = 42 mm
LX = 26 mm
LY = 2 mm (Items regarding optical members)

| Surface No. | r | d | |
|---|---|---|---|
| | (Mask surface) | 698.162435 | |
| 1 | −1168.68 | 0.0 | (first reflector M1) |
| 2 | ∞ | −349.53 | (aperture stop AS) |
| 3 | 1691.18 | 360.42 | (second reflector M2) |
| 4 | 454.48 | −127.91 | (third reflector M3) |
| 5 | 559.35 | 653.98 | (fourth reflector M4) |
| 6 | −1004.95 | −150.0 | (fifth reflector M5) |
| 7 | 3626.96 | 260.27 | (sixth reflector M6) |
| 8 | 218.57 | −365.86 | (seventh reflector M7) |
| 9 | 434.39 | 405.86 | (eighth reflector M8) |
| | (wafer surface) | | |

(Data of aspheric surfaces)

First surface $\kappa$ = 0.000000
C4 = 0.124299 × 10$^{-8}$    C6 = −0.189727 × 10$^{-13}$
C8 = 0.294028 × 10$^{-18}$   C10 = −0.433801 × 10$^{-23}$
C12 = 0.548824 × 10$^{-28}$  C14 = −0.427489 × 10$^{-33}$
C16 = 0.966411 × 10$^{-39}$ Second surface $\kappa$ = 0.000000
C4 = −0.174984 × 10$^{-8}$   C6 = −0.342044 × 10$^{-13}$
C8 = −0.680805 × 10$^{-18}$  C10 = −0.974110 × 10$^{-22}$
C12 = 0.189816 × 10$^{-25}$  C14 = −0.274840 × 10$^{-29}$
C16 = 0.155407 × 10$^{-33}$ Third surface $\kappa$ = 0.000000
C4 = −0.666006 × 10$^{-8}$   C6 = −0.371744 × 10$^{-14}$
C8 = −0.344088 × 10$^{-18}$  C10 = 0.609375 × 10$^{-23}$
C12 = 0.103068 × 10$^{-28}$  C14 = −0.827732 × 10$^{-32}$
C16 = 0.172278 × 10$^{-36}$ Fourth surface $\kappa$ = 0.000000
C4 = −0.103073 × 10$^{-8}$   C6 = −0.608918 × 10$^{-14}$
C8 = 0.662326 × 10$^{-19}$   C10 = −0.265340 × 10$^{-23}$
C12 = 0.446041 × 10$^{-28}$  C14 = −0.429901 × 10$^{-33}$
C16 = 0.150139 × 10$^{-38}$ Fifth surface $\kappa$ = 0.000000
C4 = 0.304447 × 10$^{-09}$   C6 = 0.841652 × 10$^{-14}$
C8 = −0.812334 × 10$^{-18}$  C10 = 0.246171 × 10$^{-22}$
C12 = −0.405382 × 10$^{-27}$ C14 = 0.354438 × 10$^{-32}$
C16 = −0.129616 × 10$^{-37}$ Sixth surface $\kappa$ = 0.000000
C4 = 0.125772 × 10$^{-8}$    C6 = −0.480305 × 10$^{-13}$
C8 = 0.145269 × 10$^{-17}$   C10 = −0.380203 × 10$^{-22}$
C12 = 0.642297 × 10$^{-27}$  C14 = −0.605091 × 10$^{-32}$
C16 = 0.230862 × 10$^{-37}$ Seventh surface $\kappa$ = 0.000000
C4 = −0.517488 × 10$^{-09}$  C6 = 0.153894 × 10$^{-11}$
C8 = −0.310039 × 10$^{-16}$  C10 = −0.371708 × 10$^{-21}$
C12 = 0.192144 × 10$^{-24}$  C14 = −0.799053 × 10$^{-28}$
C16 = 0.108146 × 10$^{-32}$ TABLE 2-continued Eighth surface $\kappa$ = 0.000000
C4 = 0.100557 × 10$^{-09}$   C6 = 0.671798 × 10$^{-15}$
C8 = 0.388217 × 10$^{-20}$   C10 = 0.210446 × 10$^{-25}$
C12 = 0.849528 × 10$^{-31}$  C14 = 0.138156 × 10$^{-35}$
C16 = −0.703129 × 10$^{-42}$ (Corresponding values to the conditional expressions)

$\phi$M5 = 416.69 mm
$\phi$M4 = 418.57 mm
(1)A = 22.99°
(2)A(M3) = 23.0°; A(M6) = 23.3°
(3)|$\alpha$| = 6.07°(106.00 mrad)
(4)$\phi$M = 418.57 mm (maximum at the fourth reflector M4)

Figure 6:
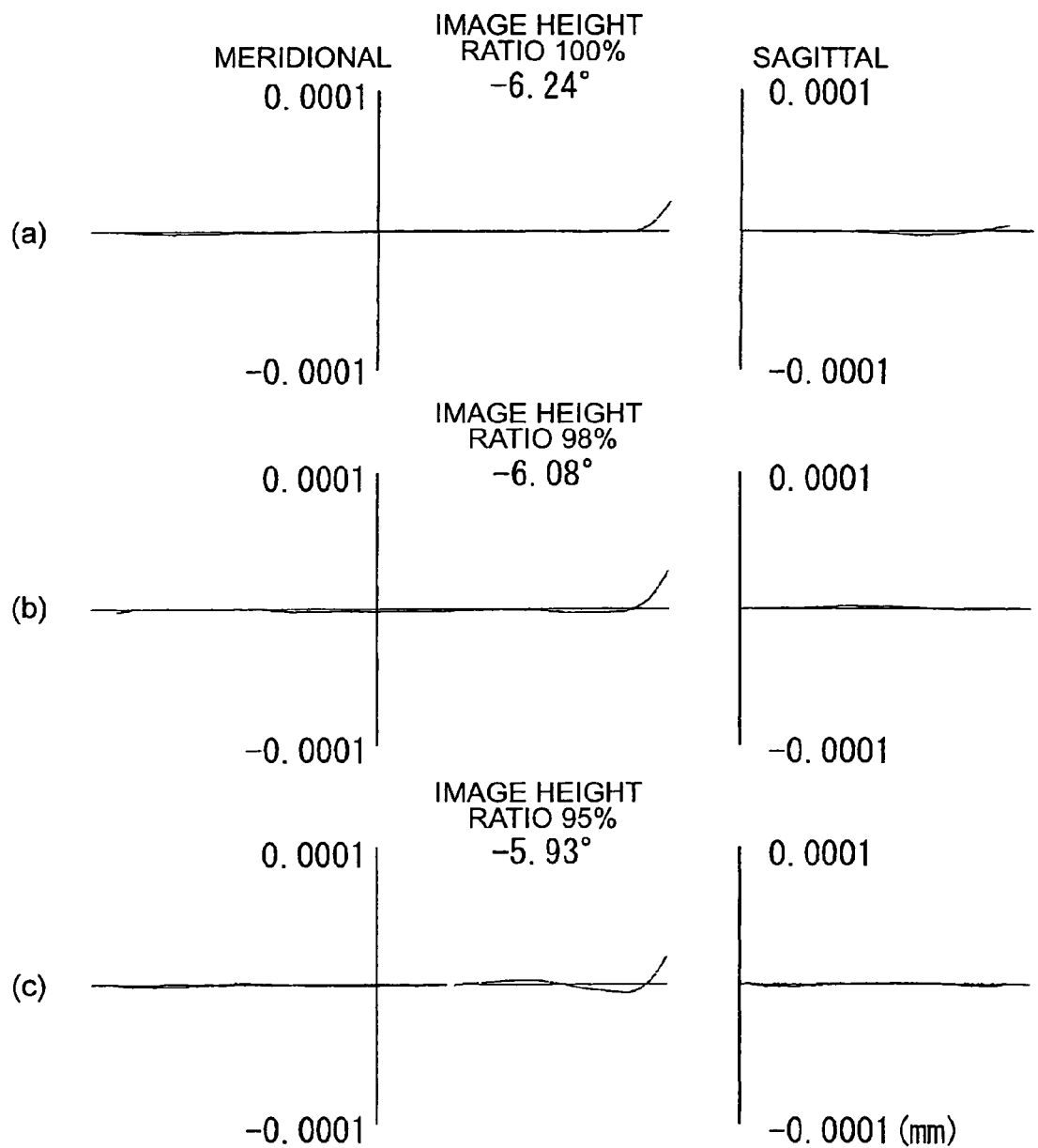
FIG. 6 is a chart showing coma generated by the projection optical system of the second example.

FIG. 6 is a chart showing coma generated by the projection optical system of the second example. FIGS. 6(a), 6(b), and 6(c) show meridional coma and sagittal coma at image heights of 100%, 98%, and 95%, respectively. The aberration charts shown in FIG. 6 clarify that coma are favorably corrected in the area corresponding to the effective exposure region ER in the second example as in the first example. Though not depicted, it has also been verified that aberrations other than coma, such as spherical aberration and distortion, are favorably corrected in the area corresponding to the effective exposure region ER.

EXAMPLE 3

Figure 7:
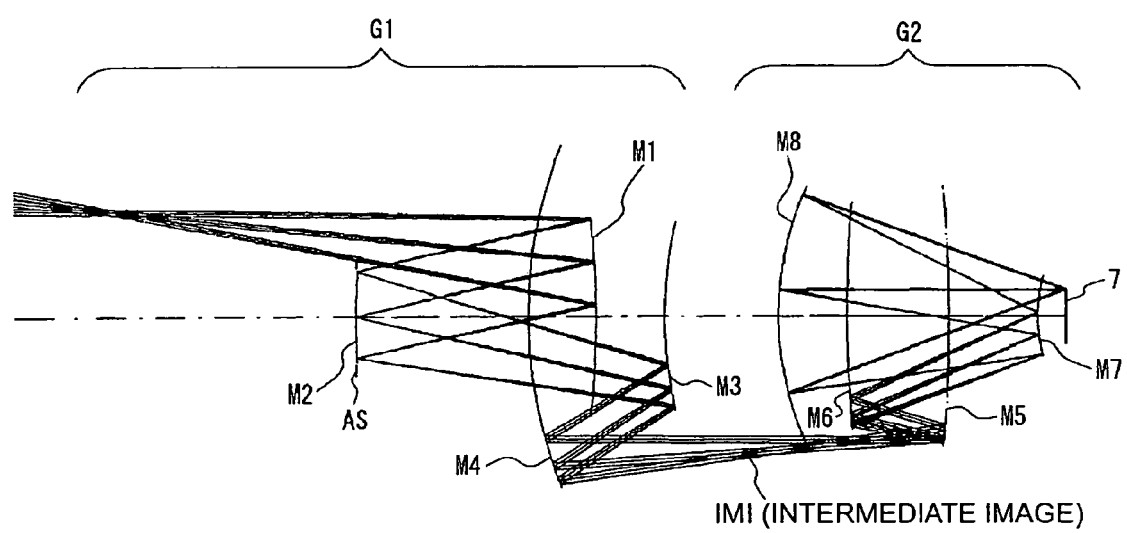
FIG. 7 is a view showing the structure of the projection optical system in accordance with a third example of the embodiment.

FIG. 7 is a view showing the structure of the projection optical system in accordance with the third example of this embodiment. Referring to FIG. 7, the light from the mask 4 (not depicted in FIG. 7) is successively reflected by the reflecting surface of the concave first reflector M1 the reflecting surface of the concave second reflector M2, the reflecting surface of the convex third reflector M3, and the reflecting surface of the concave fourth reflector M4, which constitute the first reflective imaging optical system G1, and then forms an intermediate image of a mask pattern in the projection optical system of Example 3 as in Examples 1 and 2. The light from the intermediate image of the mask pattern formed by way of the first reflective imaging optical system G1 is successively reflected by the reflecting surface of the concave fifth reflector M5, the reflecting surface of the concave sixth reflector M6, the reflecting surface of the convex seventh reflector M7, and the reflecting surface of the concave eighth reflector M8, which constitute the second reflective imaging optical system G2, and then forms a reduced image (secondary image) of the mask pattern on the wafer 7.

The following Table 3 lists values regarding items regarding the projection optical system in accordance with the third example.

TABLE 3

$\lambda$ = 13.5 nm
$\beta$ = ¼
NA = 0.35
H0 = 160 mm
$\phi$ = 40 mm
LX = 26 mm
LY = 2 mm TABLE 3-continued (Items regarding optical members)

| Surface No. | r | d | |
|---|---|---|---|
| | (Mask surface) | 713.24 | |
| 1 | −1158.35 | −353.80 | (first reflector M1) |
| 2 | ∞ | 0.0 | (aperture stop AS) |
| 3 | 1425.98 | 453.80 | (second reflector M2) |
| 4 | 402.89 | −200.00 | (third reflector M3) |
| 5 | 552.95 | 617.30 | (fourth reflector M4) |
| 6 | 5702.90 | −150.67 | (fifth reflector M5) |
| 7 | 1376.84 | 150.67 | (sixth reflector M6) |
| 8 | 276.63 | −280.13 | (seventh reflector M7) |
| 9 | 463.67 | 420.13 | (eighth reflector M8) |
| | (wafer surface) | | |

(Data of aspheric surfaces)

First surface $\kappa = 0.000000$
$C4 = 0.128617 \times 10^{-8}$         $C6 = -0.188285 \times 10^{-13}$
$C8 = 0.324576 \times 10^{-18}$        $C10 = -0.494046 \times 10^{-23}$
$C12 = 0.575650 \times 10^{-28}$       $C14 = -0.179183 \times 10^{-33}$
$C16 = -0.530288 \times 10^{-38}$ Second surface $\kappa = 0.000000$
$C4 = -0.103582 \times 10^{-8}$        $C6 = -0.245441 \times 10^{-13}$
$C8 = -0.905903 \times 10^{-18}$       $C10 = 0.172474 \times 10^{-21}$
$C12 = -0.578454 \times 10^{-25}$      $C14 = 0.904639 \times 10^{-29}$
$C16 = -0.570768 \times 10^{-33}$ Third surface $\kappa = 0.000000$
$C4 = -0.333951 \times 10^{-8}$        $C6 = -0.224217 \times 10^{-13}$
$C8 = 0.195882 \times 10^{-17}$        $C10 = -0.132099 \times 10^{-21}$
$C12 = 0.522616 \times 10^{-26}$       $C14 = -0.117092 \times 10^{-30}$
$C16 = 0.112572 \times 10^{-35}$ Fourth surface $\kappa = 0.000000$
$C4 = -0.155092 \times 10^{-9}$        $C6 = -0.842221 \times 10^{-14}$
$C8 = 0.176308 \times 10^{-18}$        $C10 = -0.285728 \times 10^{-23}$
$C12 = 0.276327 \times 10^{-28}$       $C14 = -0.150219 \times 10^{-33}$
$C16 = 0.328840 \times 10^{-39}$ Fifth surface $\kappa = 0.000000$
$C4 = 0.764043 \times 10^{-09}$        $C6 = -0.205389 \times 10^{-13}$
$C8 = -0.261546 \times 10^{-18}$       $C10 = 0.256671 \times 10^{-22}$
$C12 = -0.655065 \times 10^{-27}$      $C14 = 0.773422 \times 10^{-32}$
$C16 = -0.357232 \times 10^{-37}$ Sixth surface $\kappa = 0.000000$
$C4 = 0.749971 \times 10^{-9}$         $C6 = -0.328706 \times 10^{-13}$
$C8 = 0.778165 \times 10^{-18}$        $C10 = -0.121914 \times 10^{-22}$
$C12 = -0.755950 \times 10^{-28}$      $C14 = 0.6279920 \times 10^{-32}$
$C16 = -0.709973 \times 10^{-37}$ Seventh surface $\kappa = 0.000000$
$C4 = -0.784826 \times 10^{-09}$       $C6 = 0.132379 \times 10^{-11}$
$C8 = -0.482265 \times 10^{-16}$       $C10 = -0.225309 \times 10^{-21}$
$C12 = -0.103338 \times 10^{-25}$      $C14 = -0.702458 \times 10^{-28}$
$C16 = 0.579001 \times 10^{-32}$ Eighth surface $\kappa = 0.000000$
$C4 = 0.863876 \times 10^{-10}$        $C6 = 0.552398 \times 10^{-15}$
$C8 = 0.327438 \times 10^{-20}$        $C10 = -0.396075 \times 10^{-27}$
$C12 = 0.600985 \times 10^{-30}$       $C14 = -0.858975 \times 10^{-35}$
$C16 = 0.661938 \times 10^{-40}$ (Corresponding values to the conditional expressions)

$\phi M4 = 493.88$ mm
$\phi M5 = 375.84$ mm

TABLE 3-continued (1) $A = 21.10°$
(2) $A(M3) = 21.1°$; $A(M6) = 18.7°$
(3) $|\alpha| = 6.02° (105.00$ mrad$)$
(4) $\phi M = 493.88$ mm (maximum at the fourth reflector M4)

Figure 8:
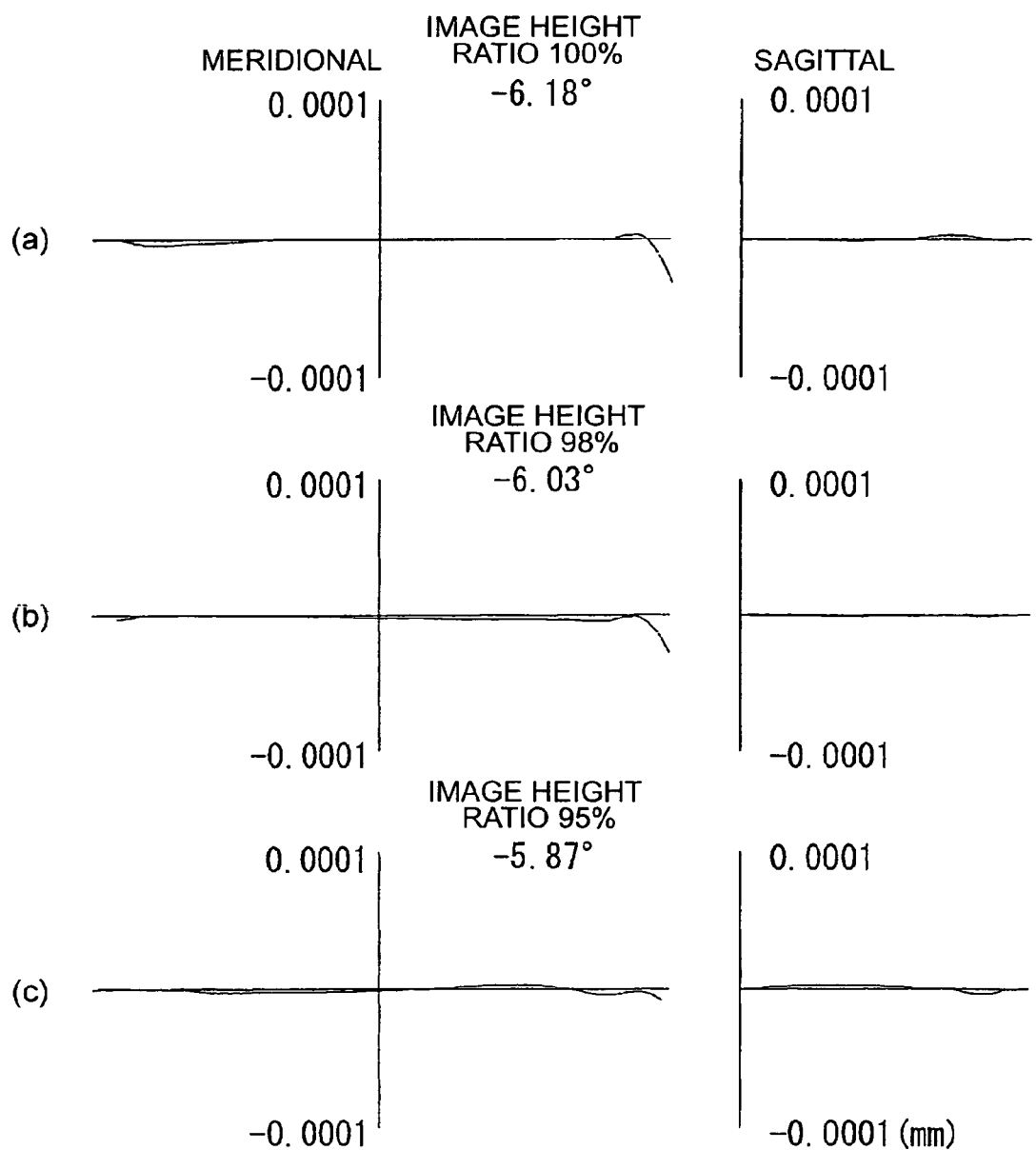
FIG. 8 is a chart showing coma generated by the projection optical system of the third example.

FIG. 8 is a chart showing coma generated by the projection optical system of the third example. FIGS. 8(*a*), 8(*b*), and 8(*c*) show meridional coma and sagittal coma at image heights of 100%, 98%, and 95%, respectively. The aberration charts shown in FIG. 8 clarify that coma are favorably corrected in the area corresponding to the effective exposure region ER in the third example 3 as in the first and second examples. Though not depicted, it has also been verified that aberrations other than coma, such as spherical aberration and distortion, are favorably corrected in the area corresponding to the effective exposure region ER.

As in the foregoing, the projection optical systems in the above-mentioned examples can secure an image-side numerical aperture of 0.35 to 0.45 with respect to the laser plasma X-ray having a wavelength of 13.5 nm, and an arc-like effective exposure region of 26 mm×2 mm in which various aberrations are favorably corrected on the wafer 7. Therefore, patterns of the mask 4 can be transferred onto exposure regions each having a size of 26 mm×66 mm, for example, on the wafer 7 with a high resolution of 0.1 µm or finer by scanning exposure.

The concave fourth and fifth reflectors M4 and M5 whose effective diameters show the largest in each of the examples mentioned above have a sufficiently small effective diameter of about 419 mm to about 494 mm. Thus, the reflectors are kept from becoming bulky, so as to reduce the size of the optical system in each example. Though reflecting surfaces are harder to manufacture accurately as they are closer to a plane by increasing their radii of curvature in general, the radius of curvature R2 in the second reflector M2 having the largest radius of curvature in each of the examples mentioned above is suppressed to 3000 mm or less, whereby reflecting surfaces can be manufactured favorably.

The maximum value A of the beam incidence angle at the M3 and M6 surfaces is 18.7° to 26.1°, and thus is suppressed to 30° or less.

The highest order of aspheric surface used in each surface is 16, which satisfies the condition of at least 10. The inclination of the image-side principal ray is substantially zero, thus yielding a telecentric optical system.

Since the angles a formed by the bundle of rays incident at the mask 4 and the bundle of rays reflected by the mask 4 respectively with respect to the optical axis AX is kept small, i.e., about 6°, the incident light and reflected light can be prevented from interfering with each other even when the reflective mask 4 is used, and shadows caused by reflection are less influential, whereby performances are hard to deteriorate. This is also advantageous in that the magnification is less likely to change greatly even when a slight error occurs in the position where the mask 4 is set.

By illuminating a mask with an illumination system (illuminating step) and exposing a transfer pattern formed on the mask to a photosensitive substrate with a projection optical system (exposure step), the exposure apparatus in accordance with the above-mentioned embodiment can manufacture microdevices (semiconductor devices, image pickup devices, liquid crystal display devices, thin-film magnetic heads, etc.). An example of technique for yielding a semiconductor device as a microdevice by forming a predetermined circuit pattern on a wafer or the like as a photosensitive substrate while using the exposure apparatus of this embodiment will now be explained with reference to the flowchart of FIG. 9.

Figure 9:
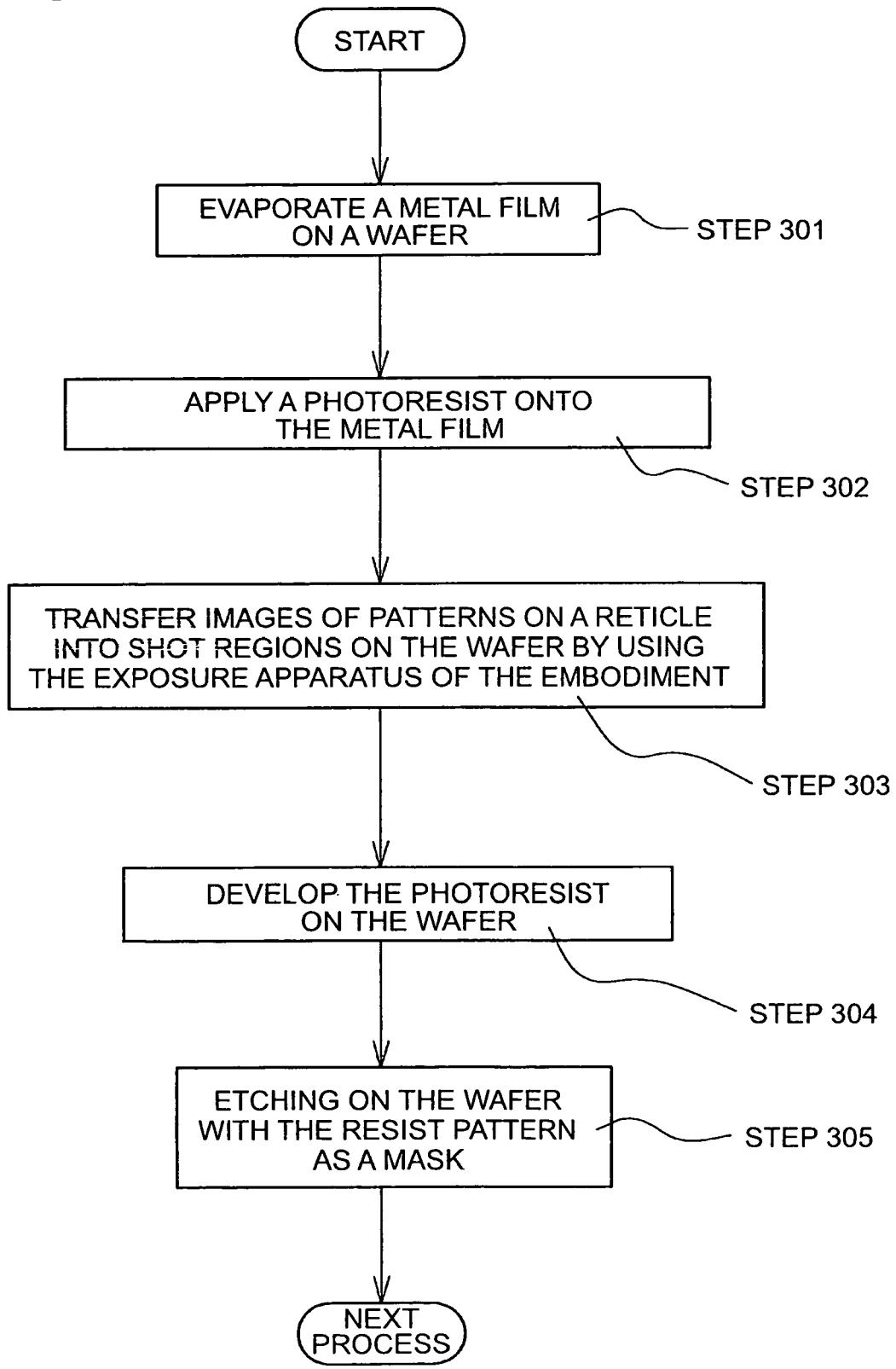
FIG. 9 is a view showing a flowchart of an example of technique for yielding a semiconductor device as a microdevice.

At step 301 in FIG. 9, a metal film is evaporated on each of wafers in one lot. At subsequent step 302, a photoresist is applied onto the metal film on each of the wafers in the lot. Thereafter, at step 303, images of patterns on a mask (reticle) are successively exposed and transferred into respective shot regions on each of the wafers in the lot, through the projection optical system, by using the exposure apparatus of this embodiment.

Thereafter, the photoresist on each of wafers in the lot is developed at step 304, and then etching is performed with the resist patterns as a mask on each of wafers in the lot at step 305, whereby circuit patterns corresponding to the patterns on the mask are formed in the respective shot regions on each wafer. Thereafter, forming of circuit patterns on upper layers and the like are carried out, so as to manufacture devices such as semiconductor devices. The above-mentioned semiconductor device manufacturing method can yield a semiconductor device having a very fine circuit pattern with a favorable throughput.

Though the above-mentioned embodiment uses a laser plasma X-ray source as a light source for supplying X-rays, this is not restrictive. For example, synchrotron radiation (SOR) light can be used as exposure light.

Though the above-mentioned embodiment employs the present invention in an exposure apparatus having a light source for supplying X-rays, this is not restrictive, whereby the present invention can also be employed in exposure apparatus having a light source for supplying wavelength light other than the X-rays.

Though the above-mentioned embodiment employs the present invention in the projection optical system of the exposure apparatus, this is not restrictive, whereby the present invention can also be employed in other typical projection optical systems.

The invention claimed is:

1. A projection optical system for forming a reduced image of a first surface onto a second surface, the projection optical system comprising:
   a first reflective imaging optical system for forming an intermediate image of the first surface; and
   a second reflective imaging optical system for forming an image of the intermediate image onto the second surface;
   wherein the first reflective imaging optical system includes a concave first reflector, a concave second reflector, a convex third reflector, and a concave fourth reflector successively as light enters from the first surface side; and
   the second reflective imaging optical system includes a concave fifth reflector, a concave sixth reflector, a convex seventh reflector, and a concave eighth reflector successively as light enters from the first surface side.

2. The projection optical system according to claim 1, wherein the fourth reflector is arranged in a space between the second and third reflectors.

3. The projection optical system according to claim 2, wherein the position of the fourth reflector satisfies the condition of $$0.2 < d1/d2 < 0.8$$

where
   d1 is the surface separation between the third and fourth reflectors, and
   d2 is the surface separation between the second and third reflectors.

4. The projection optical system according to claim 1, wherein absolute values of radii of curvature of all the reflectors fall within the range of 300 mm to 5000 mm.

5. The projection optical system according to claim 1, satisfying $$400 \text{ mm} < R3 < 2000 \text{ mm}$$

where R3 is the radius of curvature of the third reflector.

6. The projection optical system according to claim 1, satisfying $$0 < R2 < 3000 \text{ mm}$$

where R2 is the radius of curvature of the second reflector.

7. The projection optical system according to claim 1, satisfying $$0 < R6 < 4000 \text{ mm}$$

where R6 is the radius of curvature of the sixth reflector.

8. The projection optical system according to claim 1, wherein the image-side numerical aperture NA is no less than 0.3.

9. An exposure apparatus comprising an illumination system for illuminating a mask set on the first surface, and the projection optical system according to claim 1 for projecting and exposing a pattern of the mask onto a photosensitive substrate set on the second surface.

10. An exposure apparatus according to claim 9, wherein the illumination system includes a light source for supplying an X-ray as exposure light, and the exposure apparatus is configured to project and expose the pattern of the mask onto the photosensitive substrate by moving the mask and photosensitive substrate relative to the projection optical system.

11. The projection optical system according to claim 1, wherein the concave second reflector of the first reflective imaging optical system is equipped with an aperture stop.

* * * * *